United States Patent [19]

McKelvey

[11] 4,445,997

[45] May 1, 1984

[54] ROTATABLE SPUTTERING APPARATUS

[75] Inventor: Harold E. McKelvey, Plymouth, Mich.

[73] Assignee: Shatterproof Glass Corporation, Detroit, Mich.

[21] Appl. No.: 523,969

[22] Filed: Aug. 17, 1983

[51] Int. Cl.³ .............................................. C23C 15/00
[52] U.S. Cl. ................................. 204/298; 204/192 R
[58] Field of Search ......................................... 204/298

[56] References Cited

U.S. PATENT DOCUMENTS

| 4,221,652 | 9/1980 | Kuriyama | 204/298 |
| 4,290,877 | 9/1981 | Blickensderfer | 204/298 |
| 4,356,073 | 10/1982 | McKelvey | 204/298 |
| 4,362,632 | 12/1982 | Jacob | 204/298 |
| 4,374,722 | 2/1983 | Zega | 204/298 |
| 4,376,025 | 3/1983 | Zega | 204/298 |

Primary Examiner—Arthur P. Demers
Attorney, Agent, or Firm—William E. Nobbe

[57] ABSTRACT

A magnetron cathode for sputter-coating non-planar substrates, which includes a rotatable elongated tubular member having a layer of the coating material to be sputtered applied to the outer surface thereof, and magnetic means mounted in said tubular member, said tubular member being contoured longitudinally to provide a non-cylindrical sputtering surface.

11 Claims, 4 Drawing Figures

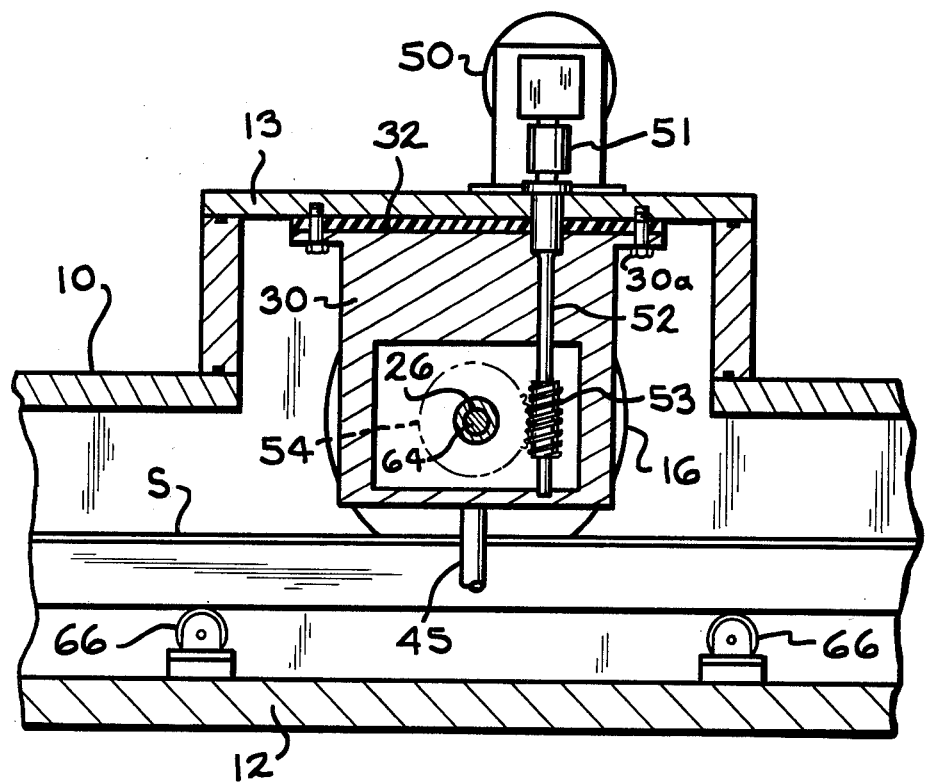
FIG. 2
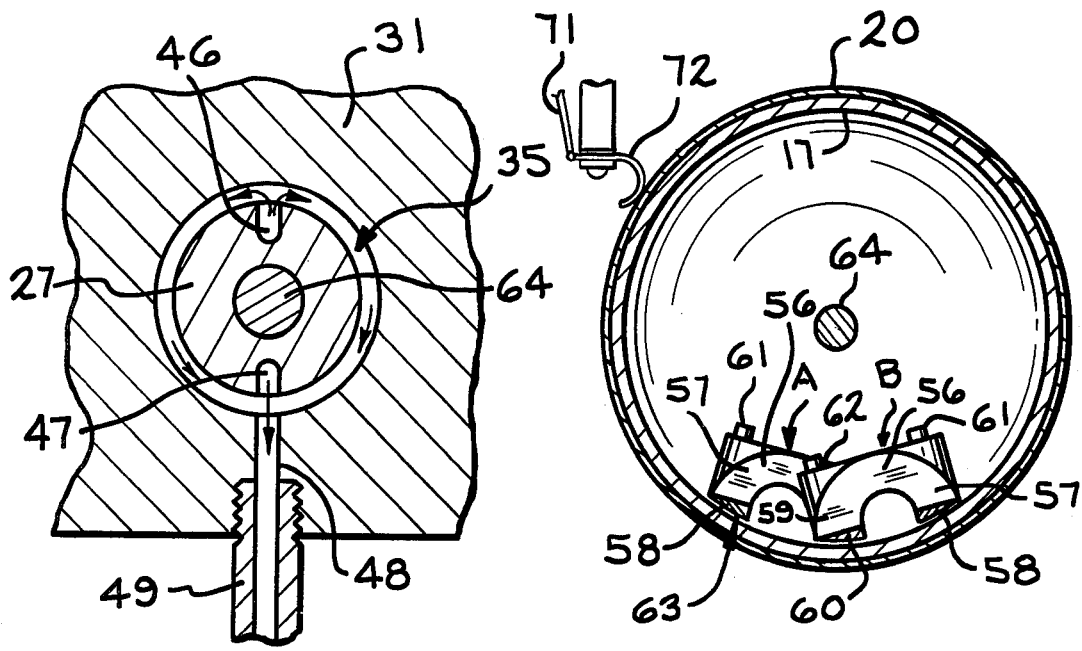
FIG. 3
FIG. 4

ROTATABLE SPUTTERING APPARATUS

BACKGROUND OF THE INVENTION

The present invention relates broadly to magnetron cathode sputtering apparatus and, in particular, to an improved rotatable cathode construction.

In U.S. Pat. No. 4,356,073, issued Oct. 26, 1982, which is assigned to the same assignee as the present application, there is disclosed a rotatable magnetron cathode operating in an evacuable coating chamber, said cathode comprising an elongated, cylindrical tubular member of substantially the same diameter throughout its length and provided with a layer of the coating material to be sputtered onto substantially planar substrates as they move relative thereto.

This invention contemplates a significantly different type of rotatable magnetron cathode in which the elongated tubular is axially contoured to effect the sputter-coating of non-planar substrates that are shaped to substantially conform to the contour of the tubular member.

Another object of the invention is to provide a rotatable magnetron cathode in which the elongated tubular member is provided with a longitudinal curved sputtering surface for sputter-coating substrate surfaces having substantially the same curvature.

Another object of the invention is to provide a rotatable magnetron cathode of substantially barrel-like configuration that is relatively wider at the middle portion than at its ends.

A further object of the invention is to provide a rotatable magnetron cathode having a non-cylindrical profile and which is of utility in the sputter-coating of bent or curved surfaces.

BRIEF DESCRIPTION OF THE DRAWINGS

FIG. 2 is a vertical transverse section taken substantially on line 2—2 of FIG. 1, FIG. 3 is a vertical transverse section taken substantially on line 3—3 of FIG. 1, and FIG. 4 is a vertical transverse section taken substantially on line 4—4 of FIG. 1.

DESCRIPTION OF PREFERRED EMBODIMENT

Figure 1:
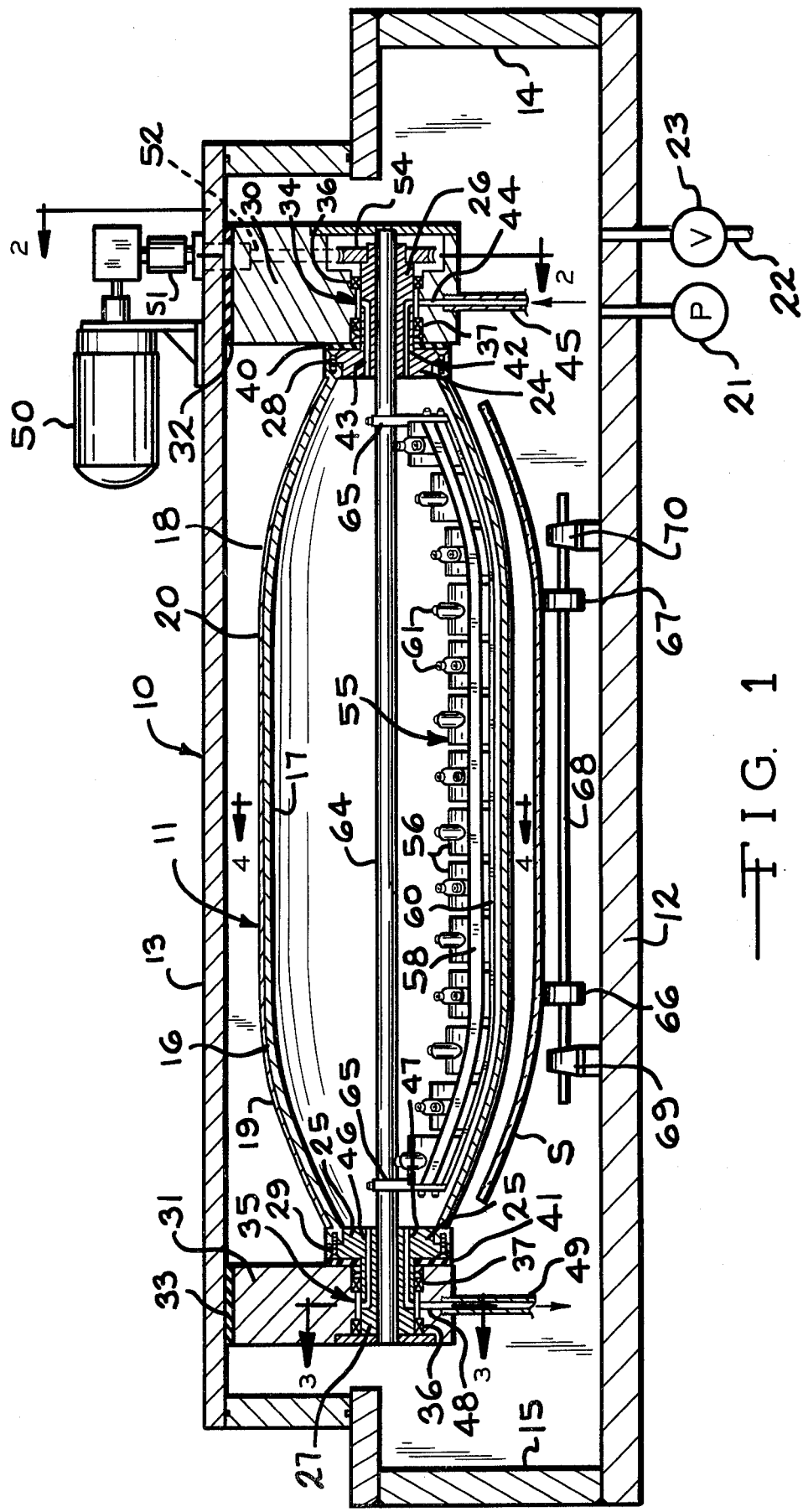
FIG. 1 is a vertical longitudinal section through a coating chamber in which is mounted a rotatable magnetron cathode constructed in accordance with the present invention.

Referring to the drawings, the numeral 10 designates an evacuable coating chamber and 11 the rotatable magnetron cathode provided by the invention mounted therein.

The coating chamber 10 is preferably rectangular and is composed of a bottom wall 12, top wall 13, opposite end walls 14 and 15 and side walls (not shown), all of said walls being secured together in sealing relation to provide a hermetically sealed chamber.

The cathode 11 comprises an elongated tubular member 16 axially contoured for sputter-coating non-planar substrates S. As shown in the drawings, the tubular member is of substantially barrel-like configuration formed with a relatively wide central portion 17 merging into tapering end portions 18 and 19. A coating 20 of a selected material to be sputtered is applied to the outer surface of the tubular member.

A vacuum pump 21 is provided to evacuate the coating chamber 10 to the desired pressure. Should it be desired to inject gases into the chamber, it may be done through conduit 22 controlled by a valve 23.

The tubular member 16 is horizontally supported at its opposite ends by the flanges 24 and 25 formed integral with the shafts 26 and 27 respectively. The tubular member may be secured to the flanges 24 and 25 by screws 28 and 29 respectively. The shafts 26 and 27 are rotatably received in bearing blocks 30 and 31 respectively secured to the top wall 13 of the coating chamber by screws 30a. The bearing blocks 30 and 31 are maintained spaced from the top wall 13 of the coating chamber by strips of insulating material 32 and 33 respectively.

The openings in the bearing blocks 30 and 31 are slightly larger in diameter than the related shafts 26 and 27 to provide relatively shallow annular channels 34 and 35 respectively surrounding said shafts. The annular channels 34 and 35 are closed at their opposite sides by bearing seals 36 and 37, said bearing seals also maintaining the shafts centrally in the openings in the bearing blocks. Insulating washers 40 and 41 are provided between the flanges 24 and 25 on shafts 26 and 27 and the bearing blocks 30 and 31 respectively to prevent any cooling medium delivered to the tubular member from entering the coating chamber.

The shaft 25 is provided with a pair of horizontal ducts 42 and 43 that lead from the annular channel 34 and communicate with the tubular member 11. Formed in the bearing block 30 is a short vertical duct 44 leading from the channel 34 to an inlet pipe 45 threaded into the bearing block. A cooling medium, such as water, is introduced through the pipe 45 and duct 44 into the channel 34 from which it flows through ducts 42 and 43 into the tubular member. The cooling medium circulates through the tubular member and exits from the opposite end thereof through horizontal ducts 46 and 47 in shaft 27 into channel 35 and thence through a vertical duct 48 in bearing block 31 to an outlet pipe 49.

The tubular member 11 is driven from one end by a motor 50 mounted upon the top wall 13 of the coating chamber, said motor being connected through an insulated coupling 51 to a vertical shaft 52 having keyed thereto a worm 53 meshing with a worm gear 54 fixed to the related shaft 26.

The magnetic means 55 comprises an array of U-shaped permanent magnets 56 arranged in two straight parallel rows A and B (FIG. 4) that extend lengthwise within the lower portion of the tubular member. The magnets in each row are aligned with one another, with the magnets in one row being disposed alternately with and overlapping the magnets in the other row. Also the magnets in the two rows A and B are arranged at an angle relative to one another as shown in FIG. 4. The outer legs 57 of the magnets 56 in each row of magnets engage a longitudinally extending, relatively narrow strip 58 of a suitable magnetic material, while the inner legs 59 of the magnets engage a similar magnetic strip 60 arranged parallel with the strips 58.

The permanent magnets are secured to the magnetic strips 58 and 60 by screws 61 and 62 respectively. The magnetic strips 58 and 60 are contoured lengthwise to conform to the axial curvature of the tubular member and the bottom surfaces 63 thereof are shaped to conform to the transverse curvature of the inner surface of said tubular member.

The U-shaped magnets 56 are preferably disposed so that the north poles thereof engage the outer magnetic strips 58 and the south poles engage the magnetic strip 60. It will be appreciated, however, that other types of permanent magnets or even electromagnets may be substituted for the U-shaped magnets.

The magnets 56 are positioned closely adjacent the inner surface of the tubular member and are supported from a horizontal rod 64 by hanger straps 65, said rod being supported at its opposite ends in the bearing blocks 26 and 27.

As stated above, the substrates S to be coated have their upper surfaces shaped to conform substantially to the longitudinal contour of the tubular member 11. The substrates are supported horizontally and moved beneath the tubular member to receive the coating material sputtered therefrom by any suitable conveying means such as by rollers 66 and 67 keyed to shafts 68 journaled in bearing supports 69 and 70 on the bottom wall of the coating chamber.

A cathode potential sufficient to cause sputtering to occur is supplied to the tubular member 16 from a D.C. power source (not shown) through a power line 71 connected to an electrical contact 72 having sliding contact with said tubular member. The apparatus may be grounded in any suitable manner.

It will be understood that changes and modifications may be made without departing from the spirit or scope of the appended claims.

I claim:

1. A sputtering cathode for sputter-coating non-planar substrates, comprising a rotatable elongated tubular member having a layer of coating material to be sputtered applied to the outer surface thereof, said tubular member being contoured longitudinally to provide a non-cylindrical sputtering surface.

2. A sputtering cathode as claimed in claim 1, in which said tubular member is of substantially barrel-like configuration.

3. A sputtering cathode as claimed in claim 1, in which said tubular member has a non-cylindrical profile.

4. A sputtering cathode as claimed in claim 1, in which said tubular member varies in diameter longitudinally thereof.

5. A sputtering cathode as claimed in claim 1, including magnetic means mounted in said tubular member.

6. A sputtering cathode as claimed in claim 5, in which said magnetic means extends lengthwise of said tubular member and is contoured to conform to the contour of said tubular member.

7. A magnetron cathode sputtering apparatus, comprising an evacuable coating chamber, a cathode including an elongated tubular member mounted in said chamber and having a layer of coating material to be sputtered applied to the outer surface thereof, said tubular member being contoured longitudinally to provide a non-cylindrical sputtering surface, magnetic means mounted in said tubular member, means for rotating said tubular about its longitudinal axis, and means for moving the substrates to be coated relative to said tubular member in a direction at right angles to the longitudinal axis thereof.

8. A magnetron cathode sputtering apparatus as claimed in claim 7, in which said tubular member is of substantially barrel-like configuration.

9. A magnetron cathode sputtering apparatus as claimed in claim 7, in which said tubular member has a non-cylindrical profile.

10. A magnetron cathode sputtering apparatus as claimed in claim 7, in which said tubular member varies in diameter longitudinally thereof.

11. A magnetron cathode sputtering apparatus as claimed in claim 7, in which said magnetic means extends lengthwise of said tubular member and is contoured to conform to the contour of said tubular member.

* * * * *